(12) United States Patent
Kubo et al.

(10) Patent No.: US 11,735,402 B2
(45) Date of Patent: Aug. 22, 2023

(54) MEASUREMENT METHOD AND MEASUREMENT APPARATUS

(71) Applicant: Tokyo Electron Limited, Tokyo (JP)

(72) Inventors: Takashi Kubo, Miyagi (JP); Kippei Sugita, Miyagi (JP); Yuhei Shimatsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/843,054

(22) Filed: Jun. 17, 2022

(65) Prior Publication Data

US 2022/0406579 A1 Dec. 22, 2022

(30) Foreign Application Priority Data

Jun. 21, 2021 (JP) .................................. 2021-102450

(51) Int. Cl.
*H01J 37/32* (2006.01)
*G01J 1/58* (2006.01)

(52) U.S. Cl.
CPC .......... *H01J 37/32917* (2013.01); *G01J 1/58* (2013.01); *H01J 2237/24507* (2013.01)

(58) Field of Classification Search
CPC ....... H01J 37/32917; H01J 2237/24507; H01J 37/32935; G01J 1/58; G01J 3/443; H05H 1/0025
See application file for complete search history.

(56) References Cited

U.S. PATENT DOCUMENTS

| 6,972,840 | B1* | 12/2005 | Gu ..................... | H01J 37/32935 356/342 |
| 2003/0038112 | A1* | 2/2003 | Liu ..................... | H01J 37/3299 216/60 |
| 2005/0009347 | A1* | 1/2005 | Matsumoto ....... | H01J 37/32174 257/E21.252 |
| 2015/0185092 | A1* | 7/2015 | Koshimizu ........... | G01K 17/20 374/29 |
| 2020/0049560 | A1* | 2/2020 | Mun ...................... | G01N 21/67 |
| 2021/0272784 | A1* | 9/2021 | Teramoto .............. | G01J 3/2823 |

FOREIGN PATENT DOCUMENTS

JP H04-338663 A 11/1992

* cited by examiner

*Primary Examiner* — Tony Ko
(74) *Attorney, Agent, or Firm* — Weihrouch IP

(57) ABSTRACT

A measurement method includes: (a) measuring an emission intensity for each wavelength of light detected from a plasma generated in a plasma processing apparatus at each different exposure time by a light receiving element; (b) specifying, with respect to each of a plurality of different individual wavelength ranges that constitutes a predetermined wavelength range, a distribution of the emission intensity in the individual wavelength range measured at an exposure time at which an emission intensity of a predetermined wavelength included in the individual wavelength range becomes an emission intensity within a predetermined range; (c) selecting a distribution of the emission intensity in the individual wavelength range from the distribution of the emission intensity specified in (b); and (d) outputting the distribution of the emission intensity selected for each individual wavelength range.

13 Claims, 10 Drawing Sheets

MEASUREMENT METHOD AND MEASUREMENT APPARATUS

CROSS-REFERENCE TO RELATED APPLICATIONS

This application is based on and claims priority from Japanese Patent Application No. 2021-102450, filed on Jun. 21, 2021 with the Japan Patent Office, the disclosure of which is incorporated herein in its entirety by reference.

TECHNICAL FIELD

Various aspects and embodiments of the present disclosure relate to a measurement method and a measurement apparatus.

BACKGROUND

Japanese Patent Laid-Open Publication No. H04-338663 describes, for example, a technique to stably measure the emission intensity of plasma.

SUMMARY

An aspect of the present disclosure is a measurement method including (a) measuring an emission intensity for each wavelength of light detected from a plasma generated in a plasma processing apparatus at each different exposure time by a light receiving element; (b) specifying, with respect to each of a plurality of different individual wavelength ranges that constitutes a predetermined wavelength range, a distribution of the emission intensity in the individual wavelength range measured at an exposure time at which an emission intensity of a predetermined wavelength included in the individual wavelength range becomes an emission intensity within a predetermined range; (c) selecting a distribution of the emission intensity in the individual wavelength range from the distribution of the emission intensity specified in (b); and (d) outputting the distribution of the emission intensity selected for each individual wavelength range.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a measurement method and a measurement apparatus will be described in detail with reference to the drawings. In addition, the measurement method and the measurement apparatus disclosed herein are not limited by the following embodiments.

In a semiconductor manufacturing process that uses a plasma, the light detected from the plasma includes light of various wavelengths caused by materials contained in the plasma. Since the emission intensity of each wavelength depends on the amount of materials contained in the plasma, the progress degree of a plasma processing may be estimated by monitoring the emission intensity of each wavelength. For example, in the etching of a film to be etched, when the emission intensity of a wavelength corresponding to the material of a film (hereinafter, referred to as "underlayer film") under the film to be etched increases, it may be presumed that the bottom of a recess formed in the film to be etched has reached the underlayer film.

However, in recent years, an opening of the recess tends to be smaller with the miniaturization of the semiconductor manufacturing process. When the opening of the recess becomes smaller than ever before, less material is released by the etching of the underlayer film even if the bottom of the recess formed in the film to be etched has reached the underlayer film. Therefore, an amount of the change in the emission intensity of the wavelength corresponding to the material of the underlayer film is reduced when the bottom of the recess formed in the film to be etched has reached the underlayer film. Therefore, there is a demand for a technique that accurately monitors a slight change in the emission intensity.

Therefore, the present disclosure provides a technique capable of accurately detecting the change in the distribution of the emission intensity for each wavelength of light detected from a plasma.

First Embodiment

Configuration of Processing System 1

Figure 1:
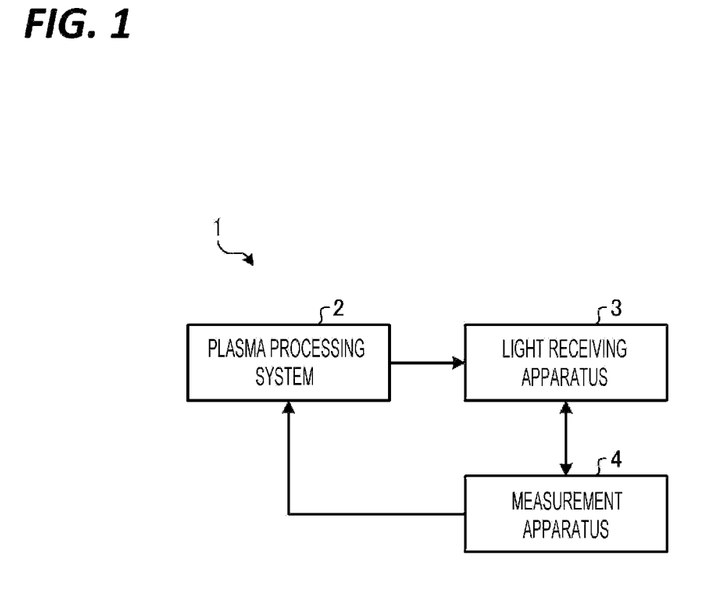
FIG. 1 is a system configuration diagram illustrating an example of a processing system according to an embodiment of the present disclosure.

FIG. 1 is a system configuration diagram illustrating an example of a processing system 1 according to an embodiment of the present disclosure. The processing system 1 includes a plasma processing system 2, a light receiving apparatus 3, and a measurement apparatus 4.

The plasma processing system 2 performs etching using a plasma on a substrate W. Further, the plasma processing system 2 acquires information about the emission intensity for each wavelength of light detected from the plasma from the measurement apparatus 4. Then, when the distribution of the emission intensity for each wavelength is changed to a predetermined distribution which is the distribution of the emission intensity at the timing of changing processing conditions, for example, the plasma processing system 2 performs a processing such as the end of etching or the change of etching conditions. Here, the processing performed by the plasma processing system 2 may be any processing such as film forming, modification, or cleaning as long as it is a processing using a plasma.

The light receiving apparatus 3 receives the light detected from the plasma generated in the plasma processing performed by the plasma processing system 2. Then, the light receiving apparatus 3 measures the emission intensity for each wavelength of the light detected from the plasma at the exposure time instructed by the measurement apparatus 4. Then, the light receiving apparatus 3 outputs information on the emission intensity for each wavelength to the measurement apparatus 4.

The measurement apparatus 4 causes the light receiving apparatus 3 to measure the emission intensity for each wavelength of the light detected from the plasma at each different exposure time while the processing using the plasma is executed by the plasma processing system 2. Then, the measurement apparatus 4 processes distribution information of the emission intensity at each exposure time measured by the light receiving apparatus 3, and outputs the processed distribution information of the emission intensity to the plasma processing system 2.

Configuration of Plasma Processing System 2

Figure 2:
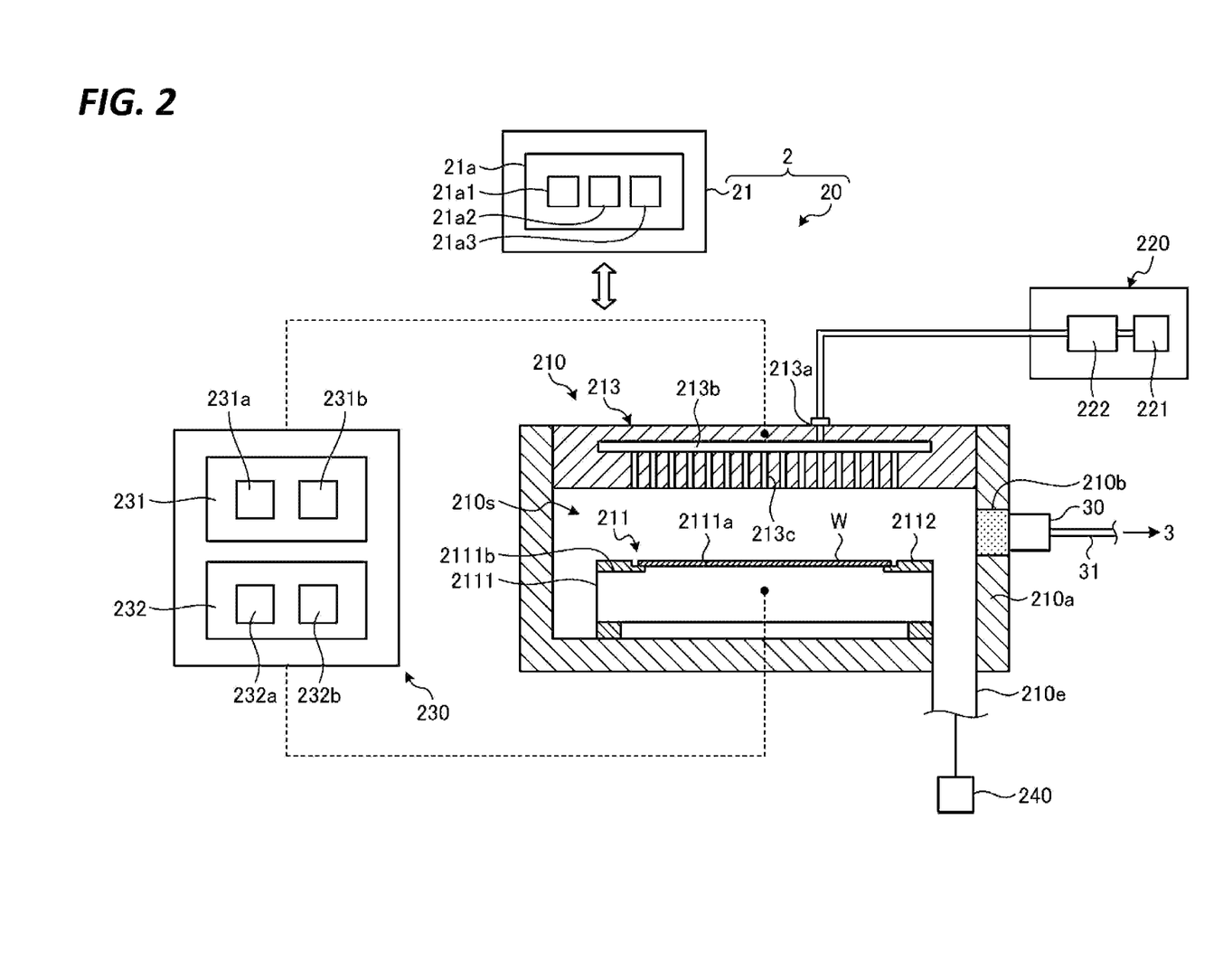
FIG. 2 is a system configuration diagram illustrating an example of a plasma processing system according to an embodiment of the present disclosure.

Hereinafter, the configuration example of the plasma processing system 2 will be described. FIG. 2 is a system configuration diagram illustrating an example of the plasma processing system 2 according to an embodiment of the present disclosure. The plasma processing system 2 includes a capacitively-coupled plasma processing apparatus 20 and a control unit 21. The plasma processing apparatus 20 includes a plasma processing chamber 210, a gas supply unit 220, a power supply 230, and an exhaust system 240. Further, the plasma processing apparatus 20 includes a substrate support unit 211 and a gas introducing unit. The gas introducing unit is configured to introduce at least one processing gas into the plasma processing chamber 210. The gas introducing unit includes a shower head 213. The substrate support unit 211 is disposed within the plasma processing chamber 210. The shower head 213 is disposed above the substrate support unit 211. In one embodiment, the shower head 213 constitutes at least a part of the ceiling of the plasma processing chamber 210.

The plasma processing chamber 210 has a plasma processing space 210s defined by the shower head 213, a sidewall 210a of the plasma processing chamber 210, and the substrate support unit 211. The plasma processing chamber 210 includes at least one gas supply port 213a for supplying the at least one processing gas to the plasma processing space 210s and at least one gas discharge port 210e for discharging the gas from the plasma processing space 210s. The sidewall 210a is grounded. The sidewall 210a is provided with a window 210b formed of a material which transmits light such as quartz. The window 210b is provided with a light condensing unit 30 having an optical member such as a lens. The light condensing unit 30 condenses light emitted by a plasma generated in the plasma processing space 210s via the window 210b, and guides the condensed light to, for example, a light guide unit 31 such as an optical fiber. The light guide unit 31 is connected to the light receiving apparatus 3 and guides the light condensed by the light condensing unit 30 to the light receiving apparatus 3. The shower head 213 and the substrate support unit 211 are electrically isolated from a housing of the plasma processing chamber 210.

The substrate support unit 211 includes a main body 2111 and a ring assembly 2112. The main body 2111 has a substrate support surface 2111a which is a central region for supporting the substrate W and a ring support surface 2111b which is an annular region for supporting the ring assembly 2112. The substrate W may also be referred to as a wafer. The ring support surface 2111b of the main body 2111 surrounds the substrate support surface 2111a of the main body 2111 in a plan view. The substrate W is placed on the substrate support surface 2111a of the main body 2111, and the ring assembly 2112 is placed on the ring support surface 2111b of the main body 2111 so as to surround the substrate W on the substrate support surface 2111a of the main body 2111.

In one embodiment, the main body 2111 includes an electrostatic chuck and a base. The base includes a conductive member. The conductive member of the base functions as a lower electrode. The electrostatic chuck is disposed on the base. The upper surface of the electrostatic chuck is the substrate support surface 2111a.

The ring assembly 2112 includes one or a plurality of annular members. The one or at least one of the plurality of annular members is an edge ring. Further, although not illustrated, the substrate support unit 211 may include a temperature adjustment module configured to adjust at least one of the electrostatic chuck, the ring assembly 2112, and the substrate W to a target temperature. The temperature adjustment module may include a heater, a heat transfer medium, a flow path, or a combination thereof. A heat transfer fluid such as a brine or a gas flows through the flow path. Further, the substrate support unit 211 may include a heat transfer gas supply configured to supply a heat transfer gas between the substrate W and the substrate support surface 2111a.

The shower head 213 is configured to introduce the at least one processing gas from the gas supply unit 220 into the plasma processing space 210s. The shower head 213 has at least one gas supply port 213a, at least one gas diffusion chamber 213b, and a plurality of gas introduction ports 213c. The processing gas supplied to the gas supply port 213a passes through the gas diffusion chamber 213b and is introduced into the plasma processing space 210s from the plurality of gas introduction ports 213c. Further, the shower head 213 includes a conductive member. The conductive member of the shower head 213 functions as an upper electrode. In addition, the gas introducing unit may include one or a plurality of side gas injectors SGI attached to one or a plurality of openings formed in the sidewall 210a, in addition to the shower head 213.

The gas supply 220 may include at least one gas source 221 and at least one flow rate controller 222. In one embodiment, the gas supply unit 220 is configured to supply the at least one processing gas from the corresponding gas source 221 to the shower head 213 via the corresponding flow rate controller 222. The flow rate controller 222 may include, for example, a mass flow controller or a pressure control type flow rate controller. Furthermore, the gas supply 220 may include one or more flow rate modulation devices that modulate or pulse the flow rate of the at least one processing gas.

The power supply 230 includes a radio frequency (RF) power supply 231 coupled to the plasma processing chamber 210 via at least one impedance matching circuit. The RF power supply 231 is configured to supply at least one RF signal such as a source RF signal and a bias RF signal to the conductive member of the substrate support unit 211 and/or the conductive member of the shower head 213. As a result, the plasma is generated from the at least one processing gas supplied to the plasma processing space 210s. Accordingly, the RF power supply 231 may function as at least a part of a plasma generator configured to generate a plasma from one or more processing gases in the plasma processing chamber 210. Further, by supplying a bias RF signal to the conductive member of the substrate support unit 211, a bias potential may be generated in the substrate W, thus drawing ion components of the generated plasma to the substrate W.

In one embodiment, the RF power supply 231 includes a first RF generating unit 231a and a second RF generating unit 231b. The first RF generating unit 231a is coupled to the conductive member of the substrate support unit 211 and/or the conductive member of the shower head 213 via at least one impedance matching circuit and is configured to create a source RF signal for plasma generation. The source RF signal may be referred to as source RF power. In one embodiment, the source RF signal has a frequency signal within the range of 13 MHz to 150 MHz. In one embodiment, the first RF generator 231a may be configured to generate a plurality of source RF signals having different frequencies. The generated one or plurality of source RF signals are supplied to the conductive member of the substrate support unit 211 and/or the conductive member of the shower head 213.

The second RF generating unit 231b is coupled to the conductive member of the substrate support unit 211 via at least one impedance matching circuit and is configured to generate a bias RF signal. The bias RF signal may be referred to as bias RF power. In one embodiment, the bias RF signal has a lower frequency than the source RF signal. In one embodiment, the bias RF signal has a frequency signal within the range of 400 kHz to 13.56 MHz. In one embodiment, the second RF generating unit 231b may be configured to generate a plurality of bias RF signals having different frequencies. The generated one or plurality of bias RF signals are supplied to the conductive member of the substrate support unit 211. Further, in various embodiments, at least one of the source RF signal and the bias RF signal may be pulsed.

Further, the power supply 230 may include a direct current (DC) power supply 232 coupled to the plasma processing chamber 210. The DC power supply 232 includes a first DC generating unit 232a and a second DC generating unit 232b. In one embodiment, the first DC generating unit 232a is connected to the conductive member of the substrate support unit 211 and is configured to generate a first DC signal. The generated first DC signal is applied to the conductive member of the substrate support unit 211. In another embodiment, the first DC signal may be applied to another electrode such as an electrode in the electrostatic chuck. In one embodiment, the second DC generating unit 232b is connected to the conductive member of the shower head 213 and is configured to generate a second DC signal. The generated second DC signal is applied to the conductive member of the shower head 213. In various embodiments, at least one of the first and second DC signals may be pulsed. In addition, the first DC generating unit 232a and the second DC generating unit 232b may be provided in addition to the RF power supply 231, and the first DC generating unit 232a may be provided in place of the second RF generating unit 231b.

The exhaust system 240 may be connected to a gas outlet 210e formed in the bottom of the plasma processing chamber 210. The exhaust system 240 may include a pressure regulation valve and a vacuum pump. The internal pressure of the plasma processing space 210s is regulated by the pressure regulation valve. The vacuum pump may include a turbo molecular pump, a dry pump, or a combination thereof.

The control unit 21 processes a computer executable command which causes the plasma processing apparatus 20 to execute various steps described in the present disclosure. The control unit 21 may be configured to control each element of the plasma processing apparatus 20 in order to execute various steps described herein. In one embodiment, a part or the entirety of the control unit 21 may be provided in the plasma processing apparatus 20. The control unit 21 may include, for example, a computer 21a. The computer 21a may include, for example, a processing unit 21a1, a storage unit 21a2, and a communication interface 21a3. The processing unit 21a1 may be configured to perform various control operations based on programs stored in the storage unit 21a2. The processing unit 21a1 may include a central processing unit (CPU). The storage unit 21a2 may include a random access memory (RAM), a read only memory (ROM), a hard disk drive (HDD), a solid state drive (SSD), or a combination thereof. The communication interface 21a3 communicates with the plasma processing apparatus 20 via a communication line such as a local area network (LAN).

Configuration of Light Receiving Apparatus 3

Figure 3:
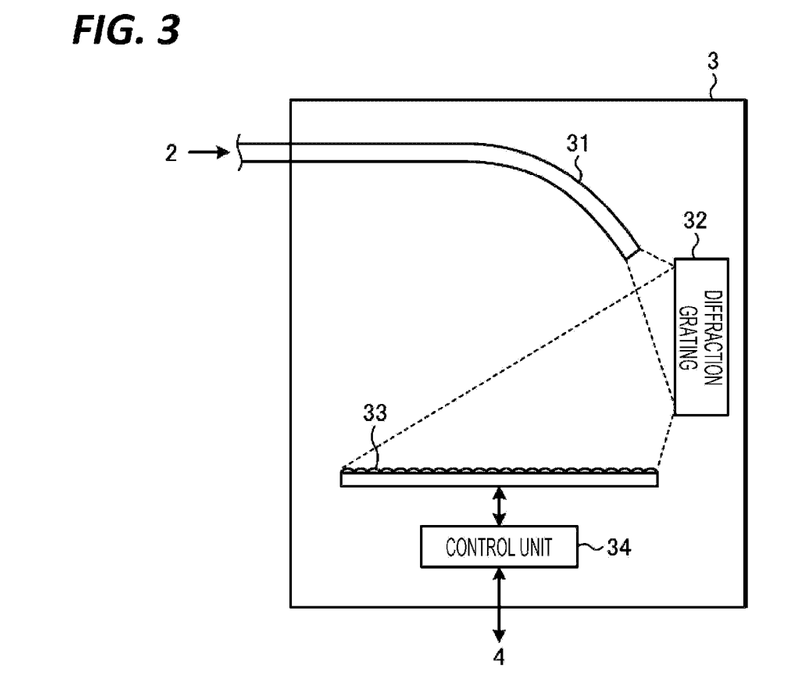
FIG. 3 is a diagram illustrating an example of a light receiving apparatus according to an embodiment of the present disclosure.

FIG. 3 is a diagram illustrating an example of the light receiving apparatus 3 according to an embodiment of the present disclosure. The light receiving apparatus 3 has the light guide unit 31, a diffraction grating 32, a light receiving element 33, and a control unit 34. The light guide unit 31 is, for example, an optical fiber, and guides the light condensed by the light condensing unit 30 into the light receiving apparatus 3 to emit the light to the diffraction grating 32.

The diffraction grating 32 separates the light guided by the light guide unit 31 for each wavelength and emits the light to the light receiving element 33. The light receiving element 33 measures the emission intensity for each wavelength of the light emitted from the diffraction grating 32 at the exposure time instructed by the control unit 34, and outputs the measured value to the control unit 34. In the present embodiment, the light receiving element 33 measures the emission intensity for each wavelength of the light emitted from the diffraction grating 32 with respect to wavelengths within a range of, for example, 100 nm or more and 1,000 nm or less. The control unit 34 instructs the exposure time instructed by the measurement apparatus 4 to the light receiving element 33. Then, the control unit 34 outputs the measured value of the emission intensity for each wavelength output from the light receiving element 33 to the measurement apparatus 4.

Configuration of Measurement Apparatus 4

Figure 4:
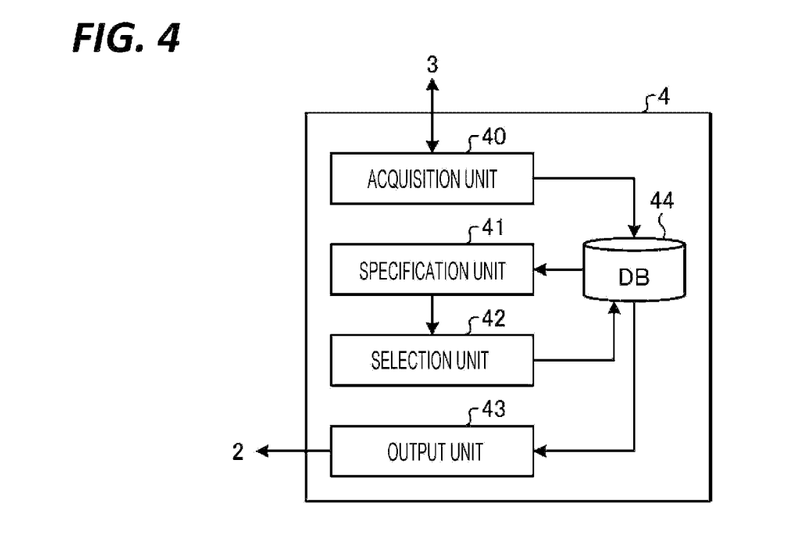
FIG. 4 is a block diagram illustrating an example of a measurement apparatus according to a first embodiment of the present disclosure.

FIG. 4 is a block diagram illustrating an example of the measurement apparatus 4 according to a first embodiment of the present disclosure. The measurement apparatus 4 includes an acquisition unit 40, a specification unit 41, a selection unit 42, an output unit 43, and a database (DB) 44.

The acquisition unit 40 instructs different exposure times to the light receiving apparatus 3. In the present embodiment, the exposure time is selected within a range of, for example, 1 msec or more and 1,000 msec or less. In the present embodiment, the acquisition unit 40 instructs the exposure times of 10 msec, 20 msec, and 60 msec to the light receiving apparatus 3, respectively. Then, the acquisition unit 40 acquires the emission intensity data for each wavelength from the light receiving apparatus 3 at each exposure time. Then, the acquisition unit 40 stores the acquired emission intensity data for each wavelength in the DB 44 in association with the exposure time.

The specification unit 41 refers to the DB 44 and specifies, with respect to each of a plurality of individual wavelength ranges constituting a predetermined wavelength range, the distribution of the emission intensity measured at the exposure time at which the emission intensity of a predetermined wavelength included in the individual wavelength range becomes the emission intensity within a predetermined range. In the present embodiment, the predetermined wavelength range is, for example, a wavelength range of 100 nm or more and 1,000 nm or less. Further, in the present embodiment, the predetermined wavelength range is divided into three individual wavelength ranges R1 to R3.

The selection unit 42 selects the distribution of the emission intensity in the individual wavelength range from the distribution of the emission intensity specified by the specification unit 41. The output unit 43 outputs the distribution of the emission intensity for each individual wavelength range selected by the selection unit 42 to the plasma processing system 2.

Measurement Method

Figure 5:
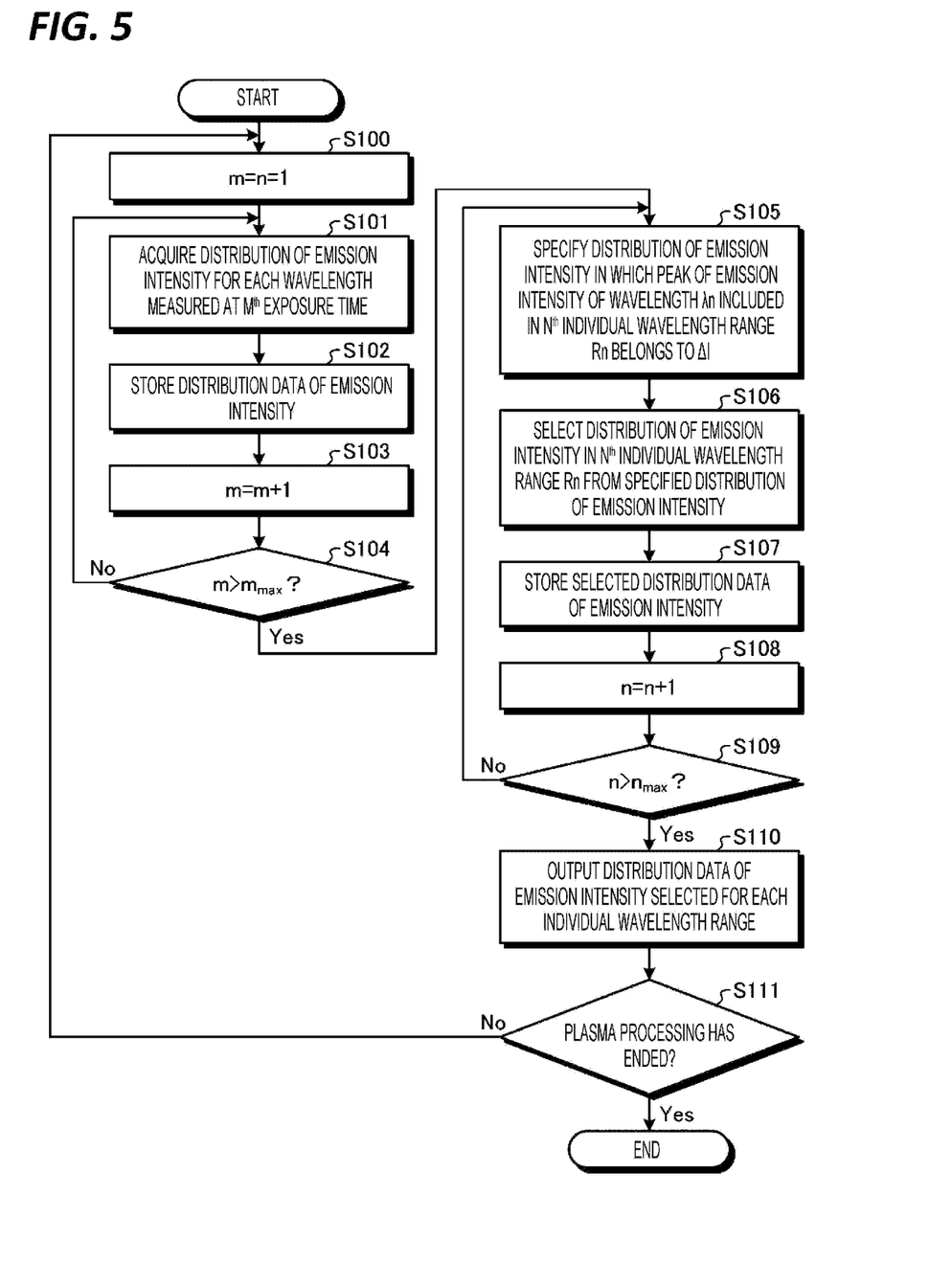
FIG. 5 is a flowchart illustrating an example of a measurement method according to the first embodiment of the present disclosure.

FIG. 5 is a flowchart illustrating an example of a measurement method according to the first embodiment of the present disclosure. Each processing illustrated in the flowchart of FIG. 5 is executed by the measurement apparatus 4. Hereinafter, the description with reference to FIGS. 6 to 9 will follow.

First, the acquisition unit 40 initializes the value of a variable m to 1, and the specification unit 41 initializes the value of a variable n to 1 (S100). Then, the acquisition unit 40 instructs the $m^{th}$ exposure time to the light receiving apparatus 3. Then, the acquisition unit 40 acquires the distribution of the emission intensity for each wavelength measured at the $m^{th}$ exposure time from the light receiving apparatus 3 (S101). Step S101 is an example of step (a). Then, the acquisition unit 40 stores the distribution data of the emission intensity for each wavelength measured at the $m^{th}$ exposure time in the DB 44 in association with the exposure time (S102).

Next, the acquisition unit 40 increases the value of the variable m by 1 (S103), and determines whether or not the value of the variable m exceeds the maximum value $m_{max}$ (S104). In the present embodiment, the maximum value $m_{max}$ is, for example, 3. When it is determined that the value of the variable m does not exceed the maximum value $m_{max}$ (S104: No), the processing illustrated in step S101 is executed again.

Figure 6:
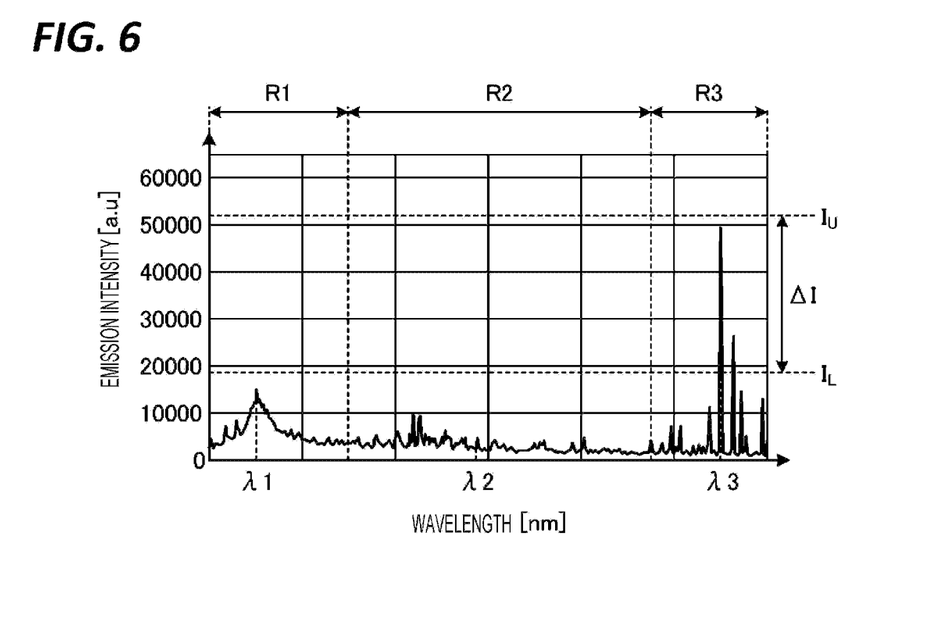
FIG. 6 is a diagram illustrating an example of a distribution of the emission intensity output from the light receiving apparatus.
Figure 7:
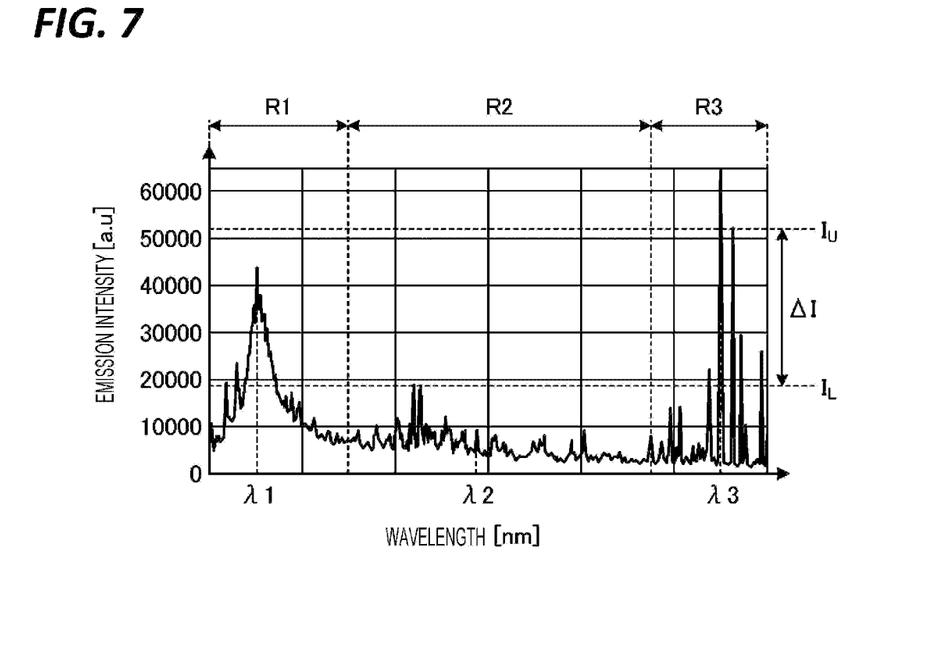
FIG. 7 is a diagram illustrating an example of the distribution of emission intensity output from the light receiving apparatus.

Here, in the present embodiment, the first exposure time is, for example, 10 msec, the second exposure time is, for example, 20 msec, and the third exposure time is, for example, 60 msec. For example, the distribution of the emission intensity for each wavelength as illustrated in FIG. 6 is measured at the exposure time of 10 msec. For example, the distribution of the emission intensity for each wavelength as illustrated in FIG. 7 is measured at the exposure time of 20 msec. For example, the distribution of the emission intensity for each wavelength as illustrated in FIG. 8 is measured at the exposure time of 60 msec.

Figure 8:
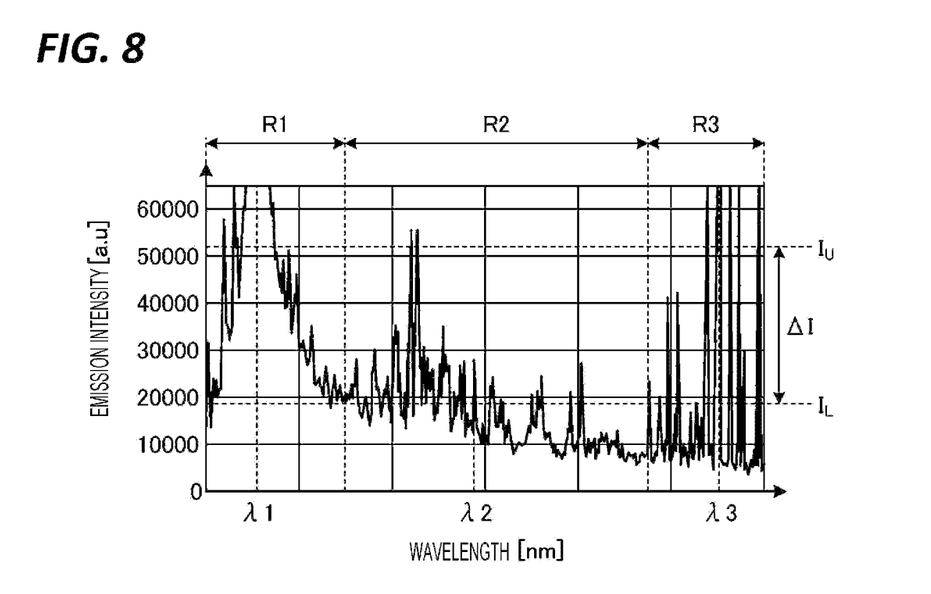
FIG. 8 is a diagram illustrating an example of a distribution of the emission intensity output from the light receiving apparatus.

In FIGS. 6 to 8, R1 to R3 are individual wavelength ranges. In the present embodiment, the individual wavelength range is, for example, a wavelength range including at least one specific wavelength representing a characteristic change in the emission intensity at the timing of changing processing conditions. The individual wavelength range R1 includes a wavelength $\lambda 1$, the individual wavelength range R2 includes a wavelength $\lambda 2$, and the individual wavelength range R3 includes a wavelength $\lambda 3$. That is, the $n^{th}$ individual wavelength range Rn includes a wavelength $\lambda n$. The wavelengths $\lambda 1$ to $\lambda 3$ are wavelengths at which the emission intensity is changed according to the progress of a plasma processing executed by the plasma processing system 2. The progress degree of the plasma processing may be estimated by monitoring a change in the emission intensity at the wavelengths $\lambda 1$ to $\lambda 3$. Further, in the present embodiment, each individual wavelength range includes one wavelength at which the emission intensity is changed according to the progress of a plasma processing executed by the plasma processing system 2. However, the disclosed technique is not limited thereto, and each individual wavelength range may include two or more wavelengths at which the emission intensity is changed according to the progress of a plasma processing executed by the plasma processing system 2.

In the examples of FIGS. 6 to 8, the emission intensity of the wavelength $\lambda 1$ is higher than the emission intensity of the wavelength $\lambda 2$, and the emission intensity of the wavelength $\lambda 3$ is higher than the emission intensity of the wavelength $\lambda 1$. As is apparent from FIGS. 6 to 8, the longer the exposure time, the larger the measured value of the emission intensity. Therefore, among wavelengths included in light detected from a plasma, the light of a wavelength having a high emission intensity may be excessively increased in the measured value of the emission intensity by the light receiving element 33 when the exposure time becomes longer. When the exposure time becomes 20 msec, for example, as illustrated in FIG. 7, the emission intensity of the wavelength $\lambda 3$ exceeds the measurement range of the emission intensity. Further, when the exposure time becomes 60 msec, for example, as illustrated in FIG. 8, the emission intensity of the wavelength $\lambda 1$ also exceeds the measurement range of the emission intensity.

Meanwhile, in the distribution of the emission intensity of FIG. 6 in which the exposure time is 10 msec, the emission intensity of the wavelength λ2 is low, so the emission intensity of the wavelength λ2 is buried in noise. Therefore, it is difficult to detect a slight change in the emission intensity of the wavelength λ2, for example, in the distribution of the emission intensity of FIG. 6. Further, when the exposure time becomes 20 msec, for example, as illustrated in FIG. 7, the emission intensity of the wavelength λ2 increases, but the influence of noise is still relatively large. However, when the exposure time becomes 60 msec, for example, as illustrated in FIG. 8, the influence of noise is reduced, and a slight change in the emission intensity of the wavelength λ2 may be detected.

Descriptions will be continued by referring back to FIG. 5. When it is determined that the value of the variable m exceeds the maximum value $m_{max}$ (S104: Yes), the specification unit 41 refers to the DB 44. Then, the specification unit 41 specifies the distribution of the emission intensity measured at the exposure time at which the peak of the emission intensity of the wavelength λ$n$ included in the $n^{th}$ individual wavelength range R$n$ belongs to a predetermined emission intensity range ΔI (S105). The predetermined emission intensity range ΔI is, for example, a range in which the measured value of the emission intensity is not saturated and is not buried in noise. Step S105 is an example of step (b). In the present embodiment, the predetermined emission intensity range ΔI is, for example, the range of 30% to 80% of the measured value range. Since the measured value range is 0 to 65,000 in the examples of FIGS. 6 to 8, the range ΔI is from the lower limit value $I_L$ corresponding to 19,500 which is 30% of the measured value range to the upper limit value $I_U$ corresponding to 52,000 which is 80% of the measured value range.

For example, the distribution of the emission intensity in which the peak of the emission intensity of the wavelength λ1 included in the first individual wavelength range R1 belongs to the range ΔI is the distribution illustrated in FIG. 7. Therefore, the specification unit 41 specifies the distribution of the emission intensity illustrated in FIG. 7 in which the exposure time is 20 msec with respect to the wavelength λ1 included in the first individual wavelength range R1.

Similarly, for example, the distribution of the emission intensity in which the peak of the emission intensity of the wavelength λ2 included in the second individual wavelength range R2 belongs to the range ΔI is the distribution illustrated in FIG. 8. Therefore, the specification unit 41 specifies the distribution of the emission intensity illustrated in FIG. 8 in which the exposure time is 60 msec with respect to the wavelength λ2 included in the second individual wavelength range R2.

Similarly, for example, the distribution of the emission intensity in which the peak of the emission intensity of the wavelength λ3 included in the third individual wavelength range R3 belongs to the range ΔI is the distribution illustrated in FIG. 6. Therefore, the specification unit 41 specifies the distribution of the emission intensity of FIG. 6 in which the exposure time is 10 msec with respect to the wavelength λ3 included in the third individual wavelength range R3.

Next, the selection unit 42 selects the distribution of the emission intensity of the $n^{th}$ individual wavelength range R$n$ from the distribution of the emission intensity specified in step S105 (S106). Step S106 is an example of step (c). Then, the selection unit 42 stores the selected distribution data of the emission intensity in the DB 44 in association with information on the $n^{th}$ individual wavelength range R$n$ (S107). For example, when the distribution of the emission intensity illustrated in FIG. 7 is specified with respect to the wavelength λ1 included in the first individual wavelength range R1, the selection unit 42 selects the distribution of the emission intensity in the individual wavelength range R1 from the distribution of the emission intensity illustrated in FIG. 7.

Next, the specification unit 41 increases the value of the variable n by 1 (S108), and determines whether or not the value of the variable n exceeds the maximum value $n_{max}$ (S109). In the present embodiment, the maximum value $n_{max}$ is, for example, three. When it is determined that the value of variable n does not exceed the maximum value $n_{max}$ (S109: No), the processing described in step S105 is executed again.

Figure 9:
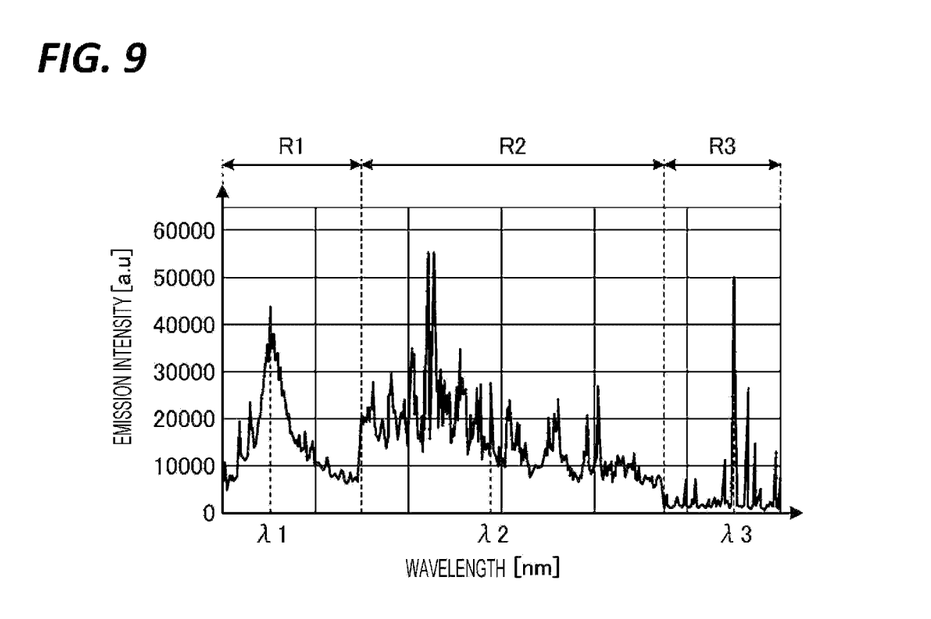
FIG. 9 is a diagram illustrating an example of a distribution of the emission intensity specified for each individual wavelength range.

Meanwhile, when it is determined that the value of the variable n exceeds the maximum value $n_{max}$ (S109: Yes), the output unit 43 refers to the DB 44 and outputs the distribution data of the emission intensity selected by the selection unit 42 for each individual wavelength range to the plasma processing system 2 (S110). Step S110 is an example of step (d). The output unit 43 may synthesize the distribution data of the emission intensity for each individual wavelength range, and may output the synthesized distribution data to the plasma processing system 2 as one data indicating the distribution of the emission intensity, for example, as illustrated in FIG. 9.

Next, the acquisition unit 40 determines whether or not the plasma processing executed by the plasma processing system 2 has ended (S111). When it is determined that the plasma processing does not end (S111: No), the processing illustrated in step S100 is executed again. Meanwhile, when the plasma processing has been terminated (S111: Yes), the measurement method illustrated in this flowchart is terminated.

The first embodiment has been described above. As described above, the measurement method in the present embodiment includes step (a), step (b), step (c), and step (d). In step (a), an emission intensity for each wavelength of light detected from a plasma generated in the plasma processing apparatus 20 is measured at each different exposure time by the light-receiving element 33. In step (b), with respect to each of a plurality of individual wavelength ranges that constitutes a predetermined wavelength range, a distribution of the emission intensity measured at an exposure time at which an emission intensity of a predetermined wavelength included in the individual wavelength range becomes an emission intensity within a predetermined range is specified. In step (c), a distribution of the emission intensity in the individual wavelength range is selected from the specified distribution of the emission intensity. In step (d), the distribution of the emission intensity selected for each individual wavelength range is output. As a result, a change in the distribution of the emission intensity for each wavelength of the light detected from the plasma may be accurately detected.

Further, in the above-described embodiment, in step (d), the distribution of the emission intensity selected for each individual wavelength range may be synthesized and output. As a result, a change in the distribution of the emission intensity may be accurately detected based on the distribution of the emission intensity over the plurality of individual wavelength ranges.

Further, in the above-described embodiment, steps (a) to (d) are repeatedly executed several times in this order. As a result, the change in the distribution of the emission intensity for each wavelength of the light detected from the plasma may be accurately detected according to a change in the emission intensity.

Further, in the above-described embodiment, in step (a), the emission intensity for each wavelength is measured at each different exposure time by the light receiving element 33 with respect to wavelengths within a range of 100 nm or more and 1,000 nm or less. As a result, the wavelength of light emitted from a material related to the progress degree of the plasma processing may be covered.

Further, in the above-described embodiment, in step (a), the emission intensity for each wavelength is measured at each different exposure time by the light receiving element with respect to the exposure time within a range of 1 msec or more and 1,000 msec or less. As a result, the distribution of the emission intensity measured at the exposure time at which the emission intensity of a predetermined wavelength becomes the emission intensity within a predetermined range may be specified.

Further, the measurement apparatus 4 in the above-described embodiment includes the acquisition unit 40, the specification unit 41, the selection unit 42, and the output unit 43. The acquisition unit 40 acquires an emission intensity for each wavelength measured at each different exposure time from the light receiving element 33 which has received light detected from a plasma generated in the plasma processing apparatus 20. The specification unit 41 specifies, with respect to each of a plurality of individual wavelength ranges that constitutes a predetermined wavelength range, a distribution of the emission intensity measured at an exposure time at which an emission intensity of a predetermined wavelength included in the individual wavelength range becomes an emission intensity within a predetermined range. The selection unit 42 selects a distribution of the emission intensity in the individual wavelength range from the specified distribution of the emission intensity. The output unit 43 outputs the distribution of the emission intensity selected for each individual wavelength range. As a result, a change in the distribution of the emission intensity for each wavelength of the light detected from the plasma may be accurately detected.

Second Embodiment

In the first embodiment, the distribution of the emission intensity measured at the exposure time at which the emission intensity of a predetermined wavelength included in the individual wavelength range becomes the emission intensity within the range ΔI is selected for each individual wavelength range. Meanwhile, in the present embodiment, the change rate of the emission intensity with respect to the exposure time is calculated for each wavelength, and emission state information indicating a distribution of the magnitude of the calculated change rate of the emission intensity with respect to the exposure time for each wavelength is output. By referring to such emission state information, a change in the emission intensity for each wavelength may be accurately detected. Hereinafter, the description will be focused mainly on differences from the first embodiment.

Configuration of Measurement Apparatus 4

Figure 10:
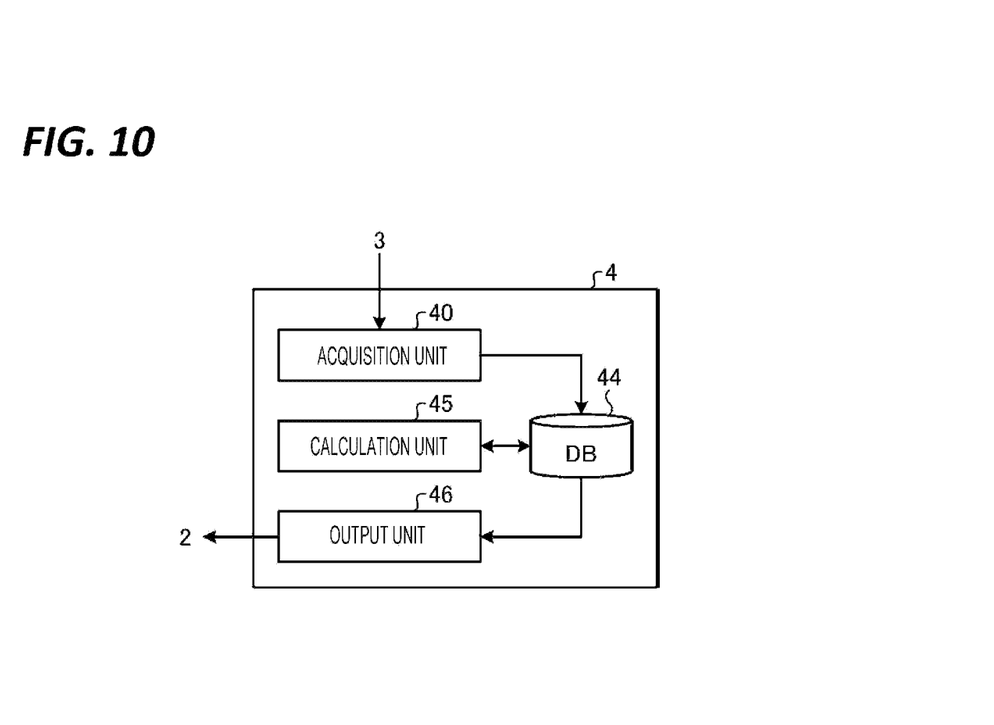
FIG. 10 is a block diagram illustrating an example of a measurement apparatus according to a second embodiment of the present disclosure.

FIG. 10 is a block diagram illustrating an example of the measurement apparatus 4 according to a second embodiment of the present disclosure. The measurement apparatus 4 in the present embodiment includes the acquisition unit 40, the DB 44, a calculation unit 45, and an output part 46. In addition, except for those to be described below, the component of FIG. 10 designated by the same reference numeral as that of FIG. 4 has the same configuration or function as the component of FIG. 4, and thus the description thereof will be omitted.

Figure 11:
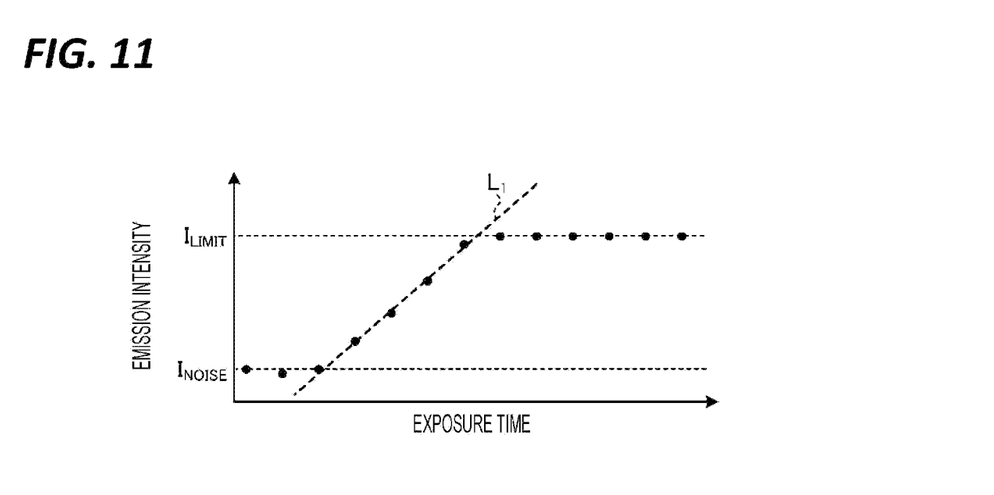
FIG. 11 is a diagram illustrating an example of a relationship between the exposure time and the emission intensity in light having a high emission intensity.
Figure 12:
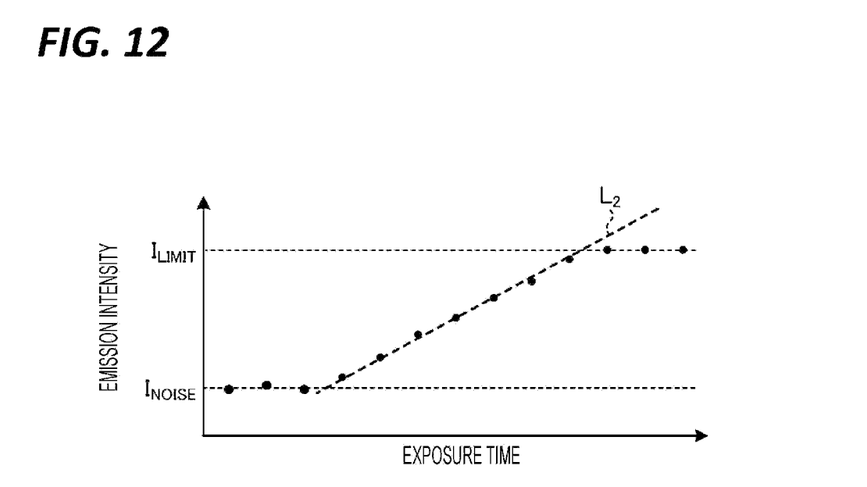
FIG. 12 is a diagram illustrating an example of a relationship between the exposure time and the emission intensity in light having a low emission intensity.

The calculation unit 45 refers to the distribution of the emission intensity for each exposure time stored in the DB 44 and calculates the change rate of the emission intensity with respect to the exposure time for each wavelength. Here, for example, as illustrated in FIGS. 11 and 12, the emission intensity is changed depending on the exposure time. Further, since the measured value of the emission intensity is buried in noise when the exposure time is relatively short, the measured value of the emission intensity is at the noise level $I_{NOISE}$. Further, when the exposure time is relatively long, the measured value of the emission intensity reaches the upper limit value $I_{LIMIT}$ of the measured value.

Further, the change rate of the emission intensity with respect to the exposure time depends on the magnitude of the emission intensity. For example, with respect to the wavelength having a relatively high emission intensity, the change rate of the emission intensity with respect to the exposure time is relatively large, for example, as illustrated in FIG. 11. In the example of FIG. 11, the change in the emission intensity between the noise level $I_{NOISE}$ and the upper limit value $I_{LIMIT}$ is approximated by a straight line $L_1$.

Meanwhile, with respect to the wavelength having a relatively low emission intensity, the change rate of the emission intensity with respect to the exposure time is smaller than the change rate of the emission intensity with respect to the exposure time illustrated in FIG. 11, for example, as illustrated in FIG. 12. In the example of FIG. 12, the change in the emission intensity between the noise level $I_{NOISE}$ and the upper limit value $I_{LIMIT}$ is approximated by a straight line $L_2$.

The calculation unit 45 approximates, for example, the change in the emission intensity within a predetermined emission intensity range by a straight line, and calculates a coefficient representing the change rate of the straight line as the change rate of the emission intensity with respect to the exposure time. For the change rate of the straight line, for example, a coefficient obtained by differentiating an equation representing the straight line with respect to the exposure time may be used. The predetermined emission intensity range is, for example, the range of the measured value of the emission intensity between the noise level $I_{NOISE}$ and the upper limit value $I_{LIMIT}$. The straight line $L_1$ illustrated in FIG. 11 and the straight line $L_2$ illustrated in FIG. 12 are approximated, for example, by the following equation (1).

$$I = at + b \quad (1)$$

In the above equation (1), t represents the exposure time, I represents the measured value of the emission intensity, and a and b represent coefficients.

For example, the calculation unit 45 calculates the coefficient a in the above equation (1) as the change rate of the emission intensity with respect to the exposure time for each wavelength. Then, the calculation unit 45 stores the calculated change rate in the DB 44 in association with wavelength information.

In addition, the calculation unit 45 may approximate the change in the emission intensity within a predetermined emission intensity range by a curve, and may calculate a coefficient representing the change rate of the curve as the change rate of the emission intensity with respect to the exposure time. For example, in FIGS. 11 and 12, the calculation unit 45 may approximate a change in the emission intensity between the noise level $I_{NOISE}$ and the upper limit value $I_{LIMIT}$ by a curve as illustrated in the following equation (2).

$$I = A(1 - e^{-Bt}) \qquad (2)$$

In the above equation (2), t represents the exposure time, I represents the measured value of the emission intensity, and A and B represent coefficients. The coefficients A and B are examples of a coefficient representing the change rate of the emission intensity with respect to the exposure time of the curve represented by the above equation (2).

Then, the calculation unit 45 may calculate, for example, the coefficient A or B in the above equation (2) or a coefficient obtained by differentiating the equation (2) with respect to the exposure time for each wavelength as the change rate of the emission intensity with respect to the exposure time.

Figure 13:
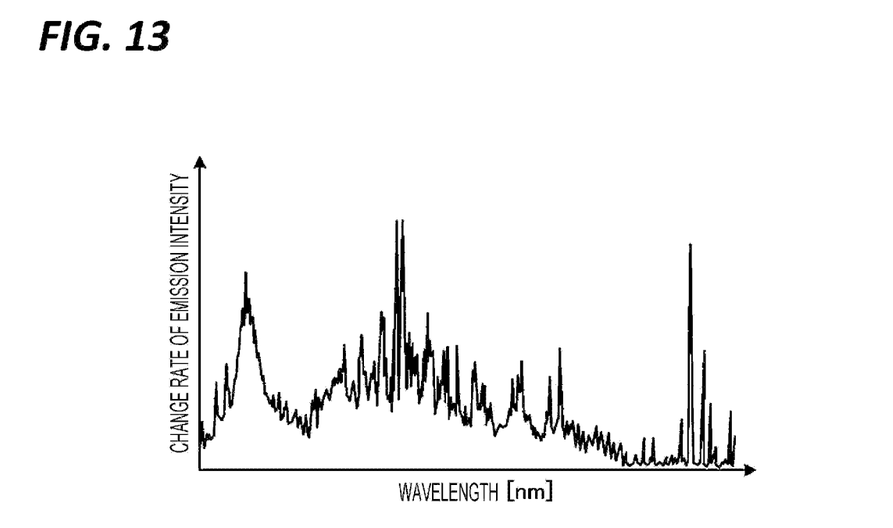
FIG. 13 is a diagram illustrating an example of emission state information.

The output unit 46 refers to information on the change rate of the emission intensity with respect to the exposure time for each wavelength stored in the DB 44, and creates emission state information indicating a distribution of the magnitude of the change rate of the emission intensity with respect to the exposure time for each wavelength. Then, the output unit 46 outputs the created emission state information to the plasma processing system 2. FIG. 13 is a diagram illustrating an example of emission state information. The emission state information indicates the magnitude of the change rate of the emission intensity with respect to the exposure time for each wavelength, and the magnitude of the change rate of the emission intensity with respect to the exposure time depends on the magnitude of the emission intensity. Therefore, the change in the magnitude of the emission intensity for each wavelength may be monitored by referring to the emission state information.

Measurement Method

Figure 14:
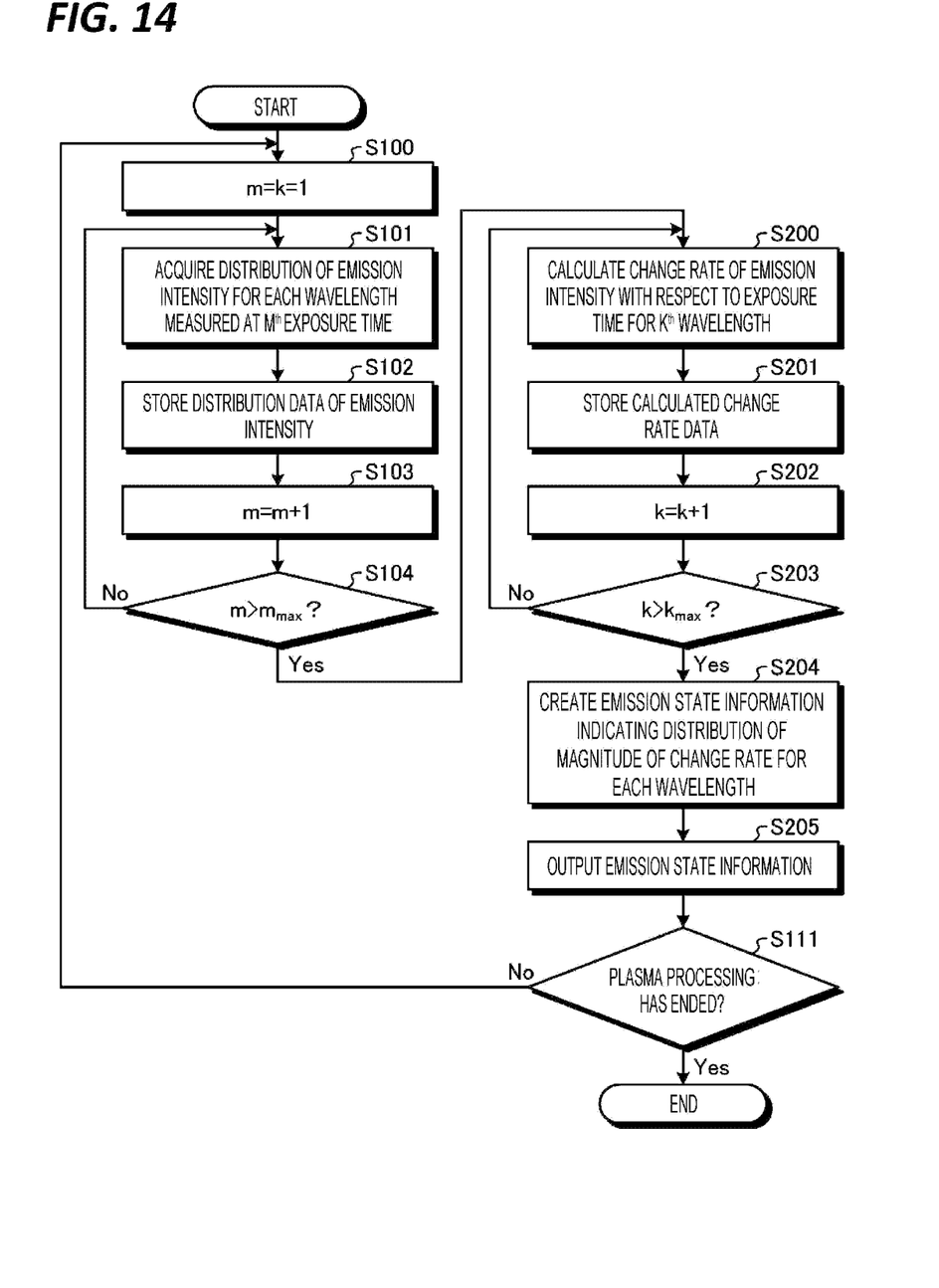
FIG. 14 is a flowchart illustrating an example of a measurement method according to the second embodiment of the present disclosure.

FIG. 14 is a flowchart illustrating an example of a measurement method according to the second embodiment of the present disclosure. Each processing illustrated in the flowchart of FIG. 14 is executed by the measurement apparatus 4. In addition, except for those to be described below, the processing of FIG. 14 designated by the same reference numeral as that of FIG. 5 is the same as the processing described in FIG. 5, and thus, the description thereof will be omitted.

In step S100, the acquisition unit 40 initializes the value of the variable m to 1, and the calculation unit 45 initializes the value of a variable k to 1 (S100).

When it is determined that the value of the variable m exceeds the maximum value $m_{max}$ (S104: Yes), the calculation unit 45 refers to the distribution of the emission intensity for each exposure time stored in the DB 44 and calculates the change rate of the emission intensity with respect to the exposure time for the $k^{th}$ wavelength (S200). Step S200 is an example of step (b). Then, the calculation unit 45 stores the calculated change rate data in the DB 44 in association with information on the $k^{th}$ wavelength (S201).

Next, the calculation unit 45 increases the value of the variable k by 1 (S202), and determines whether or not the value of the variable k exceeds the maximum value $k_{max}$ (S203). In the present embodiment, the maximum value $k_{max}$ ranges, for example, from 1,000 to 1,000,000. When it is determined that the value of the variable k does not exceed the maximum value $k_{max}$ (S203: No), the processing described in step S200 is executed again.

Meanwhile, when it is determined that the value of the variable k exceeds the maximum value $k_{max}$ (S203: Yes), the output unit 46 refers to information on the change rate of the emission intensity with respect to the exposure time for each wavelength stored in the DB 44 and creates emission state information indicating a distribution of the magnitude of the change rate of the emission intensity with respect to the exposure time for each wavelength (S204). Then, the output unit 46 outputs the created emission state information to the plasma processing system 2 (S205). Step S205 is an example of step (c). Then, the processing described in step S111 is executed.

The second embodiment has been described above. As described above, the measurement method in the present embodiment includes step (a), step (b), and step (c). In step (a), an emission intensity for each wavelength of light detected from a plasma generated in the plasma processing apparatus 20 is measured at each different exposure time by the light receiving element 33. In step (b), a change rate of the emission intensity with respect to the exposure time is calculated for each wavelength. In step (c), emission state information indicating a distribution of the magnitude of the change rate of the emission intensity with respect to the exposure time for each wavelength is output. As a result, the change in the distribution of emission intensity for each wavelength of the light detected from the plasma may be accurately detected.

Further, in the above-described embodiment, in step (b), a change in the emission intensity within a predetermined emission intensity range is approximated by a straight line or a curve, and a coefficient representing a change rate of the straight line or the curve is calculated as the change rate of the emission intensity with respect to the exposure time. As a result, the change in the distribution of emission intensity for each wavelength of the light detected from the plasma may be accurately detected.

Further, in the above-described embodiment, steps (a) to (c) are repeatedly executed several times in this order. As a result, the change rate of the emission intensity with respect to the exposure time for each wavelength of the light detected from the plasma may be accurately detected according to a change in the emission intensity.

Further, the measurement apparatus 4 in the above-described embodiment includes the acquisition unit 40, the calculation unit 45, and the output unit 46. The acquisition unit 40 acquires an emission intensity for each wavelength measured at each different exposure time from the light receiving element 33 which has received light detected from a plasma generated in the plasma processing apparatus 20. The calculation unit 45 calculates the change rate of the emission intensity with respect to the exposure time for each wavelength. The output unit 46 outputs emission state information indicating a distribution of the magnitude of the change rate of the emission intensity with respect to the exposure time for each wavelength. As a result, the change in the distribution of the emission intensity for each wavelength of the light detected from the plasma may be accurately detected.

Hardware

Figure 15:
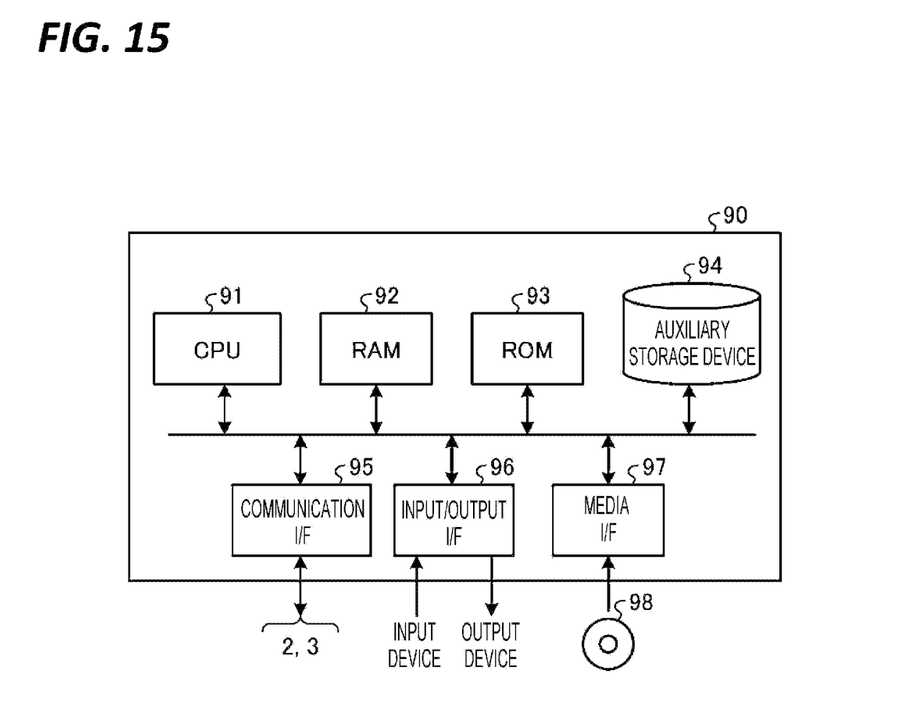
FIG. 15 is a hardware configuration diagram illustrating an example of a computer which realizes a measurement apparatus.

The measurement apparatus 4 is realized by, for example, a computer 90 having a configuration as illustrated in FIG. 13. FIG. 15 is a hardware configuration diagram illustrating an example of the computer 90 which realizes the measurement apparatus 4. The computer 90 includes a CPU 91, a RAM 92, a ROM 93, an auxiliary storage apparatus 94, a communication interface (I/F) 95, an input/output I/F 96, and a media I/F (97).

The CPU 91 operates based on programs stored in the ROM 93 or the auxiliary storage apparatus 94 to control each unit. The ROM 93 stores, for example, a booting program executed by the CPU 91 when the computer 90 is started, or a program depending on the hardware of the computer 90.

The auxiliary storage apparatus 94 is, for example, an HDD or SSD, and stores, for example, programs executed by the CPU 91 and data used by the programs. The CPU 91 reads and loads the programs from the auxiliary storage apparatus 94 onto the RAM 92, and executes the loaded programs.

The communication I/F 95 communicates with the plasma processing system 2 and the light receiving apparatus 3 via a communication line such as LAN. The communication I/F 95 receives data from the plasma processing system 2 or the light receiving apparatus 3 via the communication line to send the data to the CPU 91, and transmits data created by the CPU 91 to the plasma processing system 2 or the light receiving apparatus 3 via the communication line.

The CPU 91 controls an input device such as a keyboard and an output device such as a display via the input/output I/F 96. The CPU 91 acquires a signal input from the input device via the input/output I/F 96 to send the signal to the CPU 91. Further, the CPU 91 outputs the created data to the output device via the input/output I/F 96.

The media I/F 97 reads programs or data stored in a recording medium 98 to store them in the auxiliary storage device 94. The recording medium 98 is, for example, an optical recording medium such as a digital versatile disc (DVD) or a phase change rewritable disk (PD), a magneto-optical recording medium such as a magneto-optical disk (MO), a tape medium, a magnetic recording medium, or a semiconductor memory.

When the computer 90 functions as the measurement apparatus 4 in the first embodiment, the CPU 91 of the computer 90 realizes each function of the acquisition unit 40, the specification unit 41, the selection unit 42, and the output unit 43 by executing the programs loaded onto the RAM 92. Data such as the emission intensity is stored in the RAM 92 or the ROM 93.

Further, when the computer 90 functions as the measurement apparatus 4 in the second embodiment, the CPU 91 of the computer 90 realizes each function the acquisition unit 40, the calculation unit 45, and the output unit 46 by executing the programs loaded onto the RAM 92. Data such as the emission intensity or the change rate of the emission intensity with respect to the exposure time is stored in the RAM 92 or the ROM 93.

The CPU 91 of the computer 90 reads the programs to be loaded onto the RAM 92 from the recording medium 98 and stores the programs in the auxiliary storage device 94, but as another example, may acquire programs via the communication line from another device to store the programs in the auxiliary storage device 94. Alternatively, the CPU 91 of the computer 90 may acquire programs from another device via the communication line, and may load and execute the acquired programs onto the RAM 92.

Others

In addition, the technique disclosed herein is not limited to the above-described embodiments, and numerous modifications thereof are possible within the scope of the gist.

For example, in the first embodiment described above, the control unit 21 of the plasma processing system 2 monitors whether or not the distribution of the emission intensity for each wavelength has been changed to a predetermined distribution based on the distribution of the emission intensity for each wavelength output from the measurement apparatus 4. Then, when the distribution of the emission intensity for each wavelength has been changed to the predetermined distribution, the control unit 21 performs a processing such as the end of etching or the change of etching conditions. However, the disclosed technique is not limited thereto. As another aspect, the measurement apparatus 4 may have a function of monitoring whether or not the distribution of the emission intensity for each wavelength is changed to the predetermined distribution. In this case, the plasma processing system 2 performs a processing such as the end of etching or the change of etching conditions when the measurement apparatus 4 notifies that the distribution of the emission intensity for each wavelength has changed to the predetermined distribution.

Further, in the second embodiment described above, the control unit 21 of the plasma processing system 2 monitors whether or not the distribution of the magnitude of the change rate of the emission intensity with respect to the exposure time for each wavelength has been changed to a predetermined distribution based on the magnitude distribution of the change rate of the emission intensity with respect to the exposure time for each wavelength output from the measurement apparatus 4. Then, when the distribution of the magnitude of the change rate of the emission intensity with respect to the exposure time for each wavelength has been changed to the predetermined distribution, the control unit 21 performs a processing such as the end of etching or the change of etching conditions. However, the disclosed technique is not limited thereto. As another aspect, the measurement apparatus 4 may have a function of monitoring whether or not the distribution of the magnitude of the change rate of the emission intensity with respect to the exposure time for each wavelength has been changed to the predetermined distribution. In this case, the plasma processing system 2 performs a processing such as the end of etching or the change of etching conditions when the measurement apparatus 4 notifies that the distribution of the magnitude of the change rate of the emission intensity with respect to the exposure time for each wavelength has been changed to the predetermined distribution.

Further, the light receiving apparatus 3 and the measurement apparatus 4 have been described as separate devices in each of the above-described embodiments, but the disclosed technique is not limited thereto. As another aspect, the light receiving apparatus 3 and the measurement apparatus 4 may be realized as one apparatus.

Further, the processing system 1 has been described as executing a processing using a capacitively coupled plasma (CCP) as an example of a plasma source in the above embodiments, but the plasma source is not limited thereto. Examples of the plasma source other than the capacitively coupled plasma may include inductively coupled plasma (ICP), microwave excited surface wave plasma (SWP), electron cyclotron resonance plasma (ECP), and helicon wave excited plasma (HWP).

The measurement method or the measurement apparatus disclosed herein may be used, for example, for detecting the endpoint of a plasma processing reaction by being incorporated in a plasma processing apparatus. More specifically, when the plasma processing apparatus is an etching apparatus, the measurement method or the measurement apparatus disclosed herein may be used for detecting the endpoint of an etching reaction.

According to various aspects and embodiments of the present disclosure, it is possible to accurately detect a change in the distribution of the emission intensity for each wavelength of light detected from a plasma.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A measurement method comprising:
   (a) measuring an emission intensity for each wavelength of light detected from a plasma generated in a plasma processing apparatus at each different exposure time by a light receiving element;
   (b) specifying, with respect to each of a plurality of different individual wavelength ranges that constitutes a predetermined wavelength range, a distribution of the emission intensity in the individual wavelength range measured at an exposure time at which an emission intensity of a predetermined wavelength included in the individual wavelength range becomes an emission intensity within a predetermined range;
   (c) selecting a distribution of the emission intensity in the individual wavelength range from the distribution of the emission intensity specified in (b); and
   (d) outputting the distribution of the emission intensity selected for each individual wavelength range.

2. The measurement method according to claim 1, wherein, in (d), two or more distributions of the emission intensity selected for each individual wavelength range are synthesized and output.

3. The measurement method according to claim 1, wherein (a) to (d) are repeatedly executed several times in this order.

4. The measurement method according to claim 3, further comprising:
   (e) outputting a notification when the distribution of the emission intensity selected for each individual wavelength range is changed to a predetermined distribution.

5. The measurement method according to claim 1, wherein, in (a), the emission intensity for each wavelength is measured at each different exposure time by the light receiving element, with respect to wavelengths within a range of 100 nm or more and 1,000 nm or less.

6. The measurement method according to claim 1, wherein, in (a), the emission intensity for each wavelength is measured at each different exposure time by the light receiving element, with respect to exposure times within a range of 1 msec or more and 1,000 msec or less.

7. A measurement method comprising:
   (a) measuring an emission intensity for each wavelength of light detected from a plasma generated in a plasma processing apparatus at each different exposure time by a light receiving element;
   (b) calculating a change rate of the emission intensity with respect to the exposure time for each wavelength; and
   (c) outputting emission state information indicating a distribution of a magnitude of the change rate for each wavelength.

8. The measurement method according to claim 7, wherein, in (b), a change in the emission intensity with respect to the exposure time within a predetermined emission intensity range is approximated by a straight line or a curve, and a coefficient representing a change rate of the straight line or the curve is calculated as the change rate.

9. The measurement method according to claim 7, wherein (a) to (c) are repeatedly executed several times in this order.

10. The measurement method according to claim 7, further comprising:
    (d) outputting a notification when the distribution of the magnitude of the change rate for each wavelength in the emission state information is changed to a predetermined distribution.

11. The measurement method according to claim 7, wherein, in (a), the emission intensity for each wavelength is measured at each different exposure time by the light receiving element, with respect to wavelengths within a range of 100 nm or more and 1,000 nm or less.

12. The measurement method according to claim 7, wherein, in (a), the emission intensity for each wavelength is measured at each different exposure time by the light receiving element, with respect to the exposure time within a range of 1 msec or more and 1,000 msec or less.

13. A measurement apparatus comprising:
    an acquisition circuitry configured to acquire an emission intensity for each wavelength measured at each different exposure time from a light receiving element that has received light detected from a plasma generated in a plasma processing apparatus;
    a specification circuitry configured to specify, with respect to each of a plurality of different individual wavelength ranges that constitutes a predetermined wavelength range, a distribution of the emission intensity in the individual wavelength range measured at an exposure time at which an emission intensity of a predetermined wavelength included in the individual wavelength range becomes an emission intensity within a predetermined range;
    a selection circuitry configured to select a distribution of the emission intensity in the individual wavelength range from the distribution of the emission intensity specified by the specification circuitry; and
    an output circuitry configured to output the distribution of the emission intensity selected for each individual wavelength range.

* * * * *